United States Patent
Arvin et al.

(10) Patent No.: US 10,170,446 B2
(45) Date of Patent: *Jan. 1, 2019

(54) STRUCTURES AND METHODS TO ENABLE A FULL INTERMETALLIC INTERCONNECT

(71) Applicant: International Business Machines Corporation, Armonk, NY (US)

(72) Inventors: Charles L. Arvin, Poughkeepsie, NY (US); Christopher D. Muzzy, Burlington, VT (US); Wolfgang Sauter, Eagle-Vail, CO (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/869,673

(22) Filed: Jan. 12, 2018

(65) Prior Publication Data

US 2018/0158797 A1    Jun. 7, 2018

Related U.S. Application Data (60) Continuation of application No. 15/244,069, filed on Aug. 23, 2016, now Pat. No. 9,911,711, which is a
(Continued)

(51) Int. Cl.
*H01L 21/44*    (2006.01)
*H01L 23/00*    (2006.01)
(Continued)

(52) U.S. Cl.
CPC ............ *H01L 24/81* (2013.01); *B23K 35/025* (2013.01); *B23K 35/262* (2013.01);
(Continued)

(58) Field of Classification Search
None
See application file for complete search history.

(56) References Cited

U.S. PATENT DOCUMENTS 9,741,682 B2    8/2017  Arvin et al.
9,793,198 B2 *  10/2017 Uzoh ................ H01L 23/49811
(Continued)

OTHER PUBLICATIONS

List of IBM Patents or Patent Applications Treated as Related; (Appendix P), Filed Jan. 12, 2018; 2 pages.

*Primary Examiner* — Hung Vu
(74) *Attorney, Agent, or Firm* — Cantor Colburn LLP; Jennifer Anda (57) ABSTRACT

A method forming an interconnect structure includes depositing a first solder bump on a chip; depositing a second solder bump on a laminate, the second solder bump including a nickel copper colloid surrounded by a nickel or copper shell and suspended in a tin-based solder; aligning the chip with the laminate; performing a first reflow process to join the chip to the laminate; depositing an underfill material around the first solder bump and the second solder bump; and performing a second reflow process at a temperature that is lower than the first reflow process to convert the first solder bump and the second solder bump to an all intermetallic interconnect; wherein depositing the underfill material is performed before or after performing the second reflow process.

20 Claims, 8 Drawing Sheets

Related U.S. Application Data division of application No. 14/974,165, filed on Dec. 18, 2015, now Pat. No. 9,741,682.

(51) Int. Cl.

| | | |
|---|---|---|
| *H01L 21/56* | (2006.01) | |
| *H01L 21/48* | (2006.01) | |
| *H01L 21/52* | (2006.01) | |
| *B23K 35/26* | (2006.01) | |
| *B23K 35/30* | (2006.01) | |
| *B23K 35/02* | (2006.01) | |

(52) U.S. Cl.
CPC ........ *B23K 35/302* (2013.01); *B23K 35/3033* (2013.01); *H01L 21/4853* (2013.01); *H01L 21/52* (2013.01); *H01L 21/563* (2013.01); *H01L 24/11* (2013.01); *H01L 24/13* (2013.01); *H01L 24/16* (2013.01); *H01L 24/17* (2013.01); *H01L 2224/0401* (2013.01); *H01L 2224/05572* (2013.01); *H01L 2224/05666* (2013.01); *H01L 2224/1132* (2013.01); *H01L 2224/1147* (2013.01); *H01L 2224/11462* (2013.01); *H01L 2224/11849* (2013.01); *H01L 2224/13017* (2013.01); *H01L 2224/13022* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/13211* (2013.01); *H01L 2224/13347* (2013.01); *H01L 2224/13355* (2013.01); *H01L 2224/13447* (2013.01); *H01L 2224/13455* (2013.01); *H01L 2224/13541* (2013.01); *H01L 2224/13647* (2013.01); *H01L 2224/13655* (2013.01); *H01L 2224/16237* (2013.01); *H01L 2224/16238* (2013.01); *H01L 2224/16503* (2013.01); *H01L 2224/16507* (2013.01); *H01L 2224/17505* (2013.01); *H01L 2224/73204* (2013.01); *H01L 2224/81011* (2013.01); *H01L 2224/8112* (2013.01); *H01L 2224/81024* (2013.01); *H01L 2224/8181* (2013.01); *H01L 2224/8191* (2013.01); *H01L 2224/81193* (2013.01); *H01L 2224/81211* (2013.01); *H01L 2224/81815* (2013.01); *H01L 2224/81911* (2013.01); *H01L 2924/0132* (2013.01)

(56) References Cited

U.S. PATENT DOCUMENTS

| | | | | |
|---|---|---|---|---|
| 9,911,711 | B2 * | 3/2018 | Arvin | H01L 24/81 |
| 2012/0175147 | A1 * | 7/2012 | Nakako | B22F 9/26 |
| | | | | 174/133 R |
| 2014/0312501 | A1 * | 10/2014 | Liang | B32B 27/16 |
| | | | | 257/773 |
| 2017/0179071 | A1 | 6/2017 | Arvin et al. | |

* cited by examiner

STRUCTURES AND METHODS TO ENABLE A FULL INTERMETALLIC INTERCONNECT

DOMESTIC PRIORITY

This application is a continuation of and claims priority from U.S. patent application Ser. No. 15/244,069, entitled "STRUCTURES AND METHODS TO ENABLE A FULL INTERMETALLIC INTERCONNECT," filed on Aug. 23, 2016, which is a divisional of and claims priority from U.S. patent application Ser. No. 14/974,165, filed on Dec. 18, 2015, entitled "STRUCTURES AND METHODS TO ENABLE A FULL INTERMETALLIC INTERCONNECT," the entire contents of both applications are incorporated herein by reference.

BACKGROUND

The present invention relates to interconnect structures, and more particularly, to intermetallic joints.

Space applications may include lead-based solders, gold, and copper interconnect structures. Generally, space applications may not use tin-based solders because at low temperatures, tin-based solders may disintegrate and form tin whiskers, which is a phenomenon called "tin pest." The tin whiskers may then lead to electrical shorting of interconnects.

Some automotive and oil exploration applications use tin-based solders. However, some of these applications may need electronics that can withstand higher temperatures than traditional tin-based solders.

SUMMARY

According to an embodiment, a method forming an interconnect structure includes depositing a first solder bump on a chip; depositing a second solder bump on a laminate, the second solder bump including a nickel copper colloid surrounded by a nickel or copper shell and suspended in a tin-based solder; aligning the chip with the laminate; performing a first reflow process to join the chip to the laminate; depositing an underfill material around the first solder bump and the second solder bump; and performing a second reflow process at a temperature that is lower than the first reflow process to convert the first solder bump and the second solder bump to an all intermetallic interconnect; wherein depositing the underfill material is performed before or after performing the second reflow process.

According to another embodiment, a method of forming an interconnect structure includes depositing a first solder bump on a chip; depositing a second solder bump on a laminate, the second solder bump including a nickel copper colloid surrounded by a nickel or copper shell and suspended in a tin-based solder; aligning the chip with the laminate; performing a first reflow process to join the chip to the laminate; depositing an underfill material around the first solder bump and the second solder bump; and performing a second reflow process at a temperature below a melting point of the first solder bump and the second solder bump to convert the first solder bump and the second solder bump to an all intermetallic interconnect comprising a tin nickel copper alloy; wherein depositing the underfill material is performed before or after performing the second reflow process.

Yet, according to another embodiment, an pre-solder interconnect structure includes a first solder bump arranged on a chip; and a second solder bump arranged on a laminate, the second solder bump including a nickel copper colloid surrounded by a copper shell or a nickel shell and suspended in a tin-based solder; wherein the chip is aligned with the laminate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1-8 illustrate exemplary methods of making an all intermetallic interconnect according to various embodiments, in which:

DETAILED DESCRIPTION

The disadvantages of tin-based solders may be overcome by converting the lead-free, tin-based solders to an all intermetallic (intermetallic alloy) after the assembly process and subsequent reworks have occurred. An all intermetallic joint also increases the electro-migration (EM) performance, which leads to higher current per controlled collapse chip connection (C4). Converting to an all intermetallic joint increases the application space for server processors and ASICs-based server applications.

However, one challenge of converting a tin-based solder to an all intermetallic is that the volume of solder in the joint may prevent sufficient conversion. Further, the conversion process may lead to transformations that are reliability concerns on the substrate due to the copper substrate being compromised under the resist.

Accordingly, various embodiments described herein provide methods of creating a pre-solder structure with colloids that include a nickel copper (NiCu) alloy surrounded by a metallic shell. The colloids are properly loaded to drive a full intermetallic conversion after soldering. The method includes the subsequent thermal excursion needed to complete the conversion from the tin-based solder to an all intermetallic joint through annealing steps performed after chip join and subsequent reworks. The conversion process occurs using low temperatures and short conversion times.

The described methods and structures avoid tin whisker and tin pest challenges associated with tin-based solders. The methods and structures enable the ability to pass higher current through the interconnects, as well as increase the melting point to enable deep oil drilling and automotive applications that are not shielded from engine heat.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1:
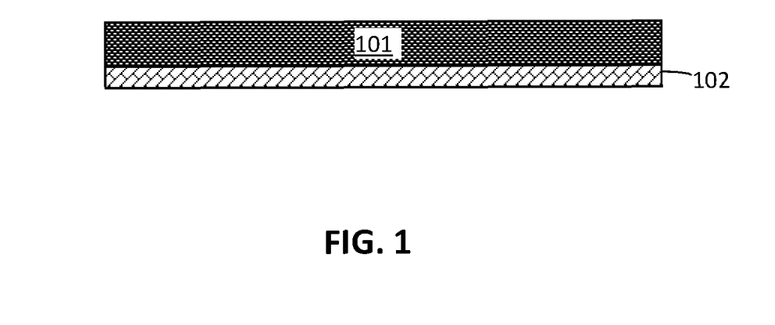
FIG. 1 is a cross-sectional side view of a die/chip having a dielectric layer arranged on a surface.

Turning now to the Figures, FIGS. 1-8 illustrate an exemplary method of making an all intermetallic interconnect according to various embodiments. FIG. 1 is a cross-sectional side view of a chip 101 having a dielectric layer 102 arranged on a surface of chip 101. The chip 101 may have any suitable surface. The chip 101 may be, for example, a board, a die, or a wafer. The chip 101 may include, but is not limited to, Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

A dielectric layer 102 is arranged on a surface of the chip 101. The dielectric layer 102 may include one or more dielectric materials. In an exemplary embodiment, the dielectric layer 102 includes a photosensitive material, such as a photosensitive polyimide (PSPI). The PSPI layer may be formed by spin-applying a solvent-soluble polyimide on the surface of the chip 101. Other non-limiting examples of materials for the dielectric layer 102 include an insulating polymer, oxide, nitride (SiN, SiON), silicon nitride, or carbide dielectrics (SiC, SiCN, SiCO).

Figure 2:
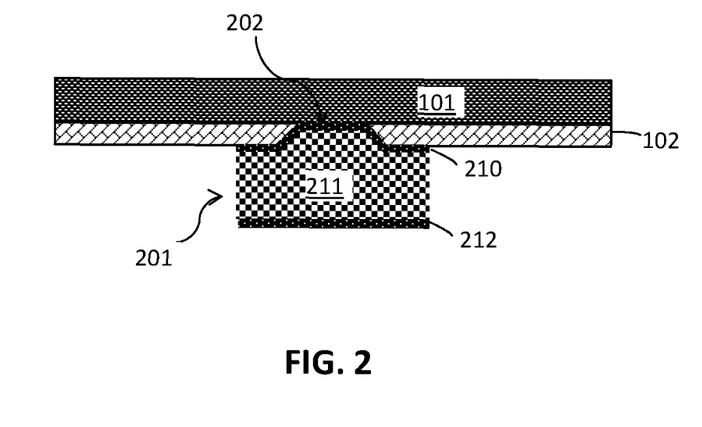
FIG. 2 is a cross-sectional side view after forming a ball limiting metallurgy (BLM) structure on the chip.

FIG. 2 is a cross-sectional side view after patterning a hole (via 202) in the dielectric layer 102 and depositing a ball limiting metallurgy (BLM) structure 201 on the dielectric layer 102 and within the via 202. The via 202 may be formed in the dielectric layer 102 such that a top surface of the chip 101 is exposed. The via 202 is formed in the dielectric layer 102 using lithography and etching.

The BLM structure 201 includes one or more layers of metals and/or metal compounds sequentially deposited by evaporation or physical vapor deposition (PVD) methods (e.g., sputtering) over the dielectric layer 102 and the via 202. The layers of BLM structure 201 may include, but is not limited to, titanium (Ti), titanium (10%) tungsten (90%) (TiW), nickel (Ni), chromium copper (CrCu), copper (Cu), and nickel sulfur (NiS) that are sequentially deposited through a mask and wet etched to remove excess BLM alloys. Other materials may include Au, Ti, TiN, W, Ta, TaN, TaSiN, WCN, and the like which provide adhesion, diffusion and electrochemical migration protection. BLM structure 201 improves adhesion of subsequently deposited solder bumps that electrically interconnect the chip 101 to another surface.

The BLM structure 201 shown in FIG. 2, includes a barrier layer 210 that may include TiW or Ti, a Cu layer 211, and an optional Ni layer 212. The Ni layer 212 inhibits the solder from consuming the Cu layer 211. Although, as mentioned above, the BLM structure 201 is not limited to these layers and materials.

Figure 3:
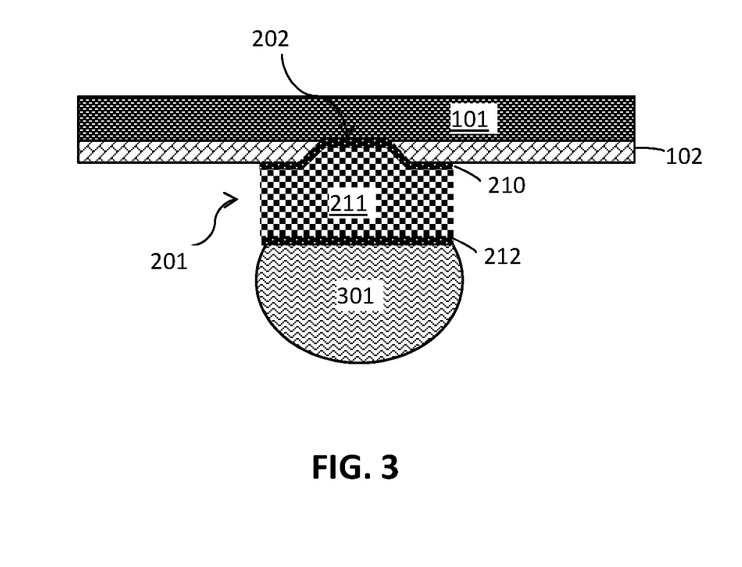
FIG. 3 is a cross-sectional side view after depositing a tin-based solder bump on the BLM.

FIG. 3 is a cross-sectional side view after depositing a tin-based solder bump 301 (first solder bump) on the BLM structure 201. The tin-based solder bump 301 is applied to the BLM structure 201. The tin-based solder bump 301 and the BLM structure 201 are electrically coupled to the chip 101. The tin-based solder bump 301 includes pure tin (Sn) or a mixture of tin and other and one or more metals. The tin-based solder bump 301 may include, but is not limited to, silver, copper, nickel or a combination thereof. The tin-based solder bump 301 may be a tin alloy, for example. The tin-based solder bump 301 includes at least 80 atomic % (at. %) tin in some embodiments. In other embodiments, the tin-based solder bump 301 includes about 60 to about 100 at. % tin.

Although one tin-based solder bump 301 and BLM structure 201 is shown in FIG. 3, multiple tin-based solder bumps 301 and BLM structures 201 may be formed on the chip 101. The tin-based solder bumps 301 may be formed on the BLM structure 201 by electroplating a solder paste on the BLM structure 201 through a patterned mask disposed over the chip 101.

Figure 4:
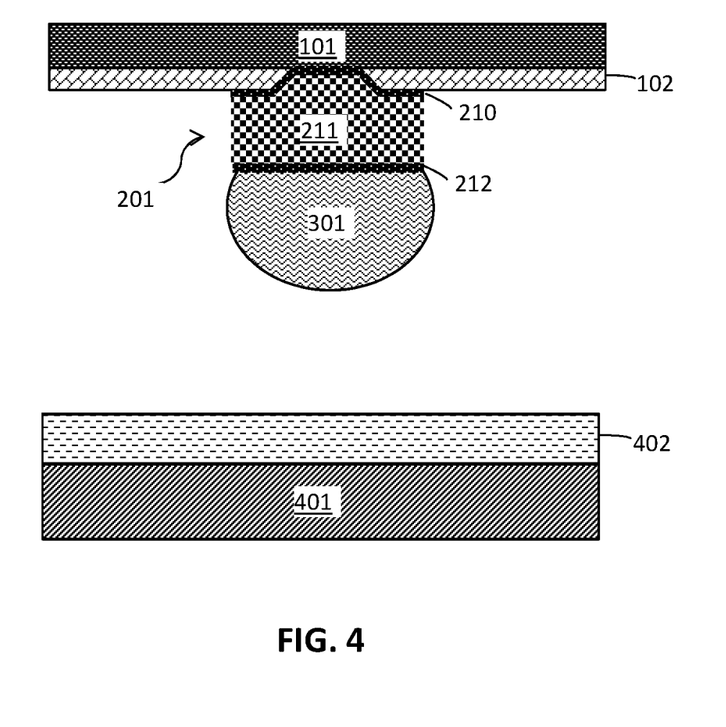
FIG. 4 is a cross-sectional side view after providing a laminate having a dielectric layer arranged on a surface.

FIG. 4 is a cross-sectional side view after providing a laminate 401 having a dielectric layer 402 arranged on a surface. The laminate 401 may be any second surface, for example, an interposer, printed circuit board, or other device. The laminate 401 may include, for example, silicon, ceramic, glass, polymers, copper, or any combination thereof.

The dielectric layer 402 may include one or more dielectric materials. In an exemplary embodiment, the dielectric layer 402 includes a photosensitive material, such as a photosensitive polyimide (PSPI). The PSPI layer may be formed by spin-applying a solvent-soluble polyimide on the surface of the laminate 401. Other non-limiting examples of materials for the dielectric layer 402 include an insulating polymer, a solder mask, oxide, nitride (SiN, SiON), silicon nitride, or carbide dielectrics (SiC, SiCN, SiCO).

Figure 5:
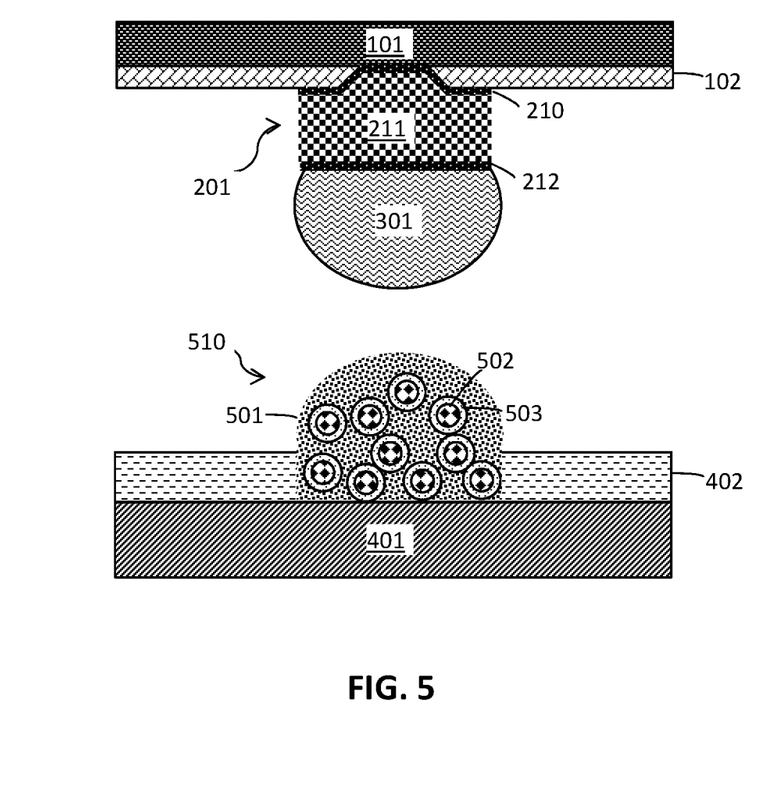
FIG. 5 is a cross-sectional side view after depositing a solder bump on the laminate.

FIG. 5 is a cross-sectional side view after depositing a solder bump 510 (second solder bump) on the laminate 401. The bump 510 may be formed by first creating an opening in the dielectric layer 402. When the dielectric layer 402 is photosensitive material, the dielectric layer may be exposed to a desired pattern of radiation to create the opening. If the dielectric layer 402 is not a photosensitive material, the opening may be created by for example, lithography and etching. The opening through the dielectric layer 402 exposes a surface of the laminate 401. After creating the opening, the solder bump 510 may be formed on the laminate 401 within the opening by screen/stencil printing through a patterned mask.

The solder bump 510 includes nickel copper colloids 502 surrounded by a nickel or copper shell 503. The metallic shell includes nickel in some embodiments or copper in other embodiments. The nickel copper colloids 502 surrounded by the metallic shell 503 are suspended in a tin-based solder 501. The nickel or copper shell 503 prevents the nickel copper colloids 502 (alloys) from contacting the tin-based solder 501 until the anneal process is performed.

The tin-based solder 501 may include pure tin (Sn) or a mixture of tin and other and one or more metals. In an exemplary embodiment, the tin-based solder 501 is a tin silver alloy. The tin-based solder 501 may include, but is not limited to, silver, copper, nickel or a combination thereof. The tin-based solder 501 may be a tin alloy, for example, a tin silver alloy. The tin-based solder 501 includes at least 80 atomic % (at. %) tin in some embodiments. In other embodiments, the tin-based solder 501 includes about 60 to about 100 at. % tin.

In one exemplary embodiment, the solder bumps 510 may be formed by utilizing a screening operation where a paste containing SnAg solder and the smaller colloids of NiCu alloy surrounded by a Cu or Ni shell is screened through a mask into the specific areas desired on the laminate. The laminate is then sent through a reflow process where the organic binder is removed leaving behind a SnAgCu or SnAgNi alloy with the smaller colloids uniformly dispersed.

In some embodiments, the nickel copper colloids 502 include about 0.05 to about 0.5 at. % nickel, or about 0.1 to about 0.2 at. % nickel. In other embodiments, the solder bumps 510 include about 0.05 to about 5 at. % copper, or about 0.5 to about 2 at. % copper. The nickel copper colloids 502 are substantially fully mixed composition present in multiple grain sizes.

The nickel or copper shell 503 surrounding and protecting the nickel copper colloids 502 may have a thickness of about 0.1 to about 2.0 microns, 0.1 to about 0.5 microns, or about 0.5 to about 1.0 microns.

Although in embodiments shown in FIGS. 1-5, the chip 101 is prepared before the laminate 401, the laminate 401 may be prepared before the chip 101 in other embodiments.

Figure 6:
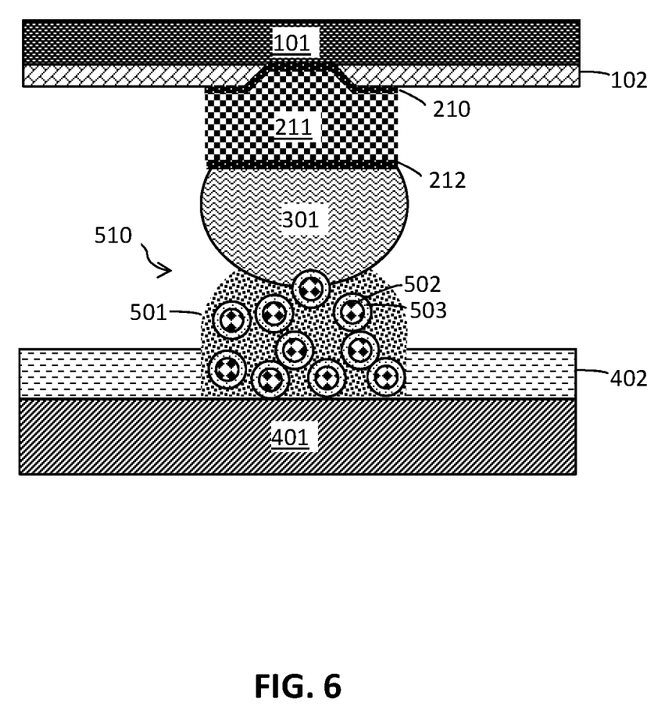
FIG. 6 is a cross-sectional side view after joining the chip to the laminate.

FIG. 6 is a cross-sectional side view after joining the chip 101 to the laminate 401. The tin-based solder bump 301 arranged on the chip 101 is aligned with the solder bump 501 on the laminate 401 and a reflow process (first reflow) is employed to join the chip 101 to the laminate 401.

Prior to joining the chip 101 to the laminate 401, a flux composition (not shown) may be applied to the laminate 401 before alignment with the chip 101 to facilitate the formation of the interconnect. The flux acts as an adhesive to the components in place pending soldering and removes oxide materials, thereby improving the electrical and mechanical interconnection and reliability between the chip 101 and the laminate 401. The soldering flux may be, for example, a rosin flux, a water-soluble flux, or a no-clean flux.

During the reflow process, controlled heat is applied to the chip 101 and the die 401 to melt the tin-based solder bump 301 and the solder bump 510. The reflow temperature may about 210 to about 300° C., or about 230 to about 250° C. For example, the assembly including the chip 101 and the laminate 401 may be passed through a reflow oven, belt furnace, or under an infrared lamp. In another example, the joints may be soldered with a hot air pencil. The tin-based solder bump 301 and solder bump 510 are heated above the melting points of the soldering metals, and then the temperature is reduced to join the aligned structures. The nickel or copper shell 503 protects the nickel copper colloids 502 from contacting the surrounding tin-based solder 501 during this reflow step.

After reflow soldering, if flux is used, it is cleaned or removed. The flux may be removed by, for example, using a suitable solvent. Such solvents include aromatics, such as xylene, toluene, terpene, and alcohols, such as methanol, ethanol, isopropanol, tetrahydrofuryl-2-carbinol, or mixtures thereof.

Figure 7:
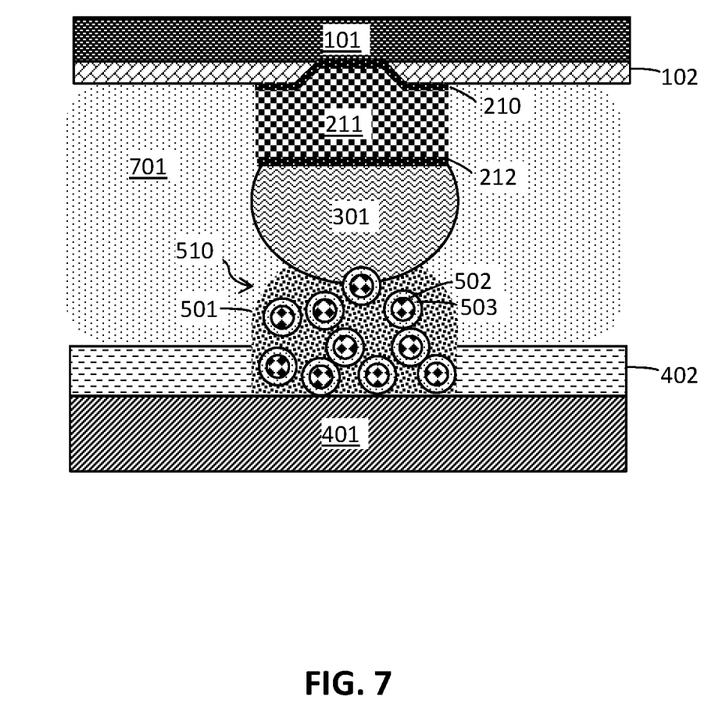
FIG. 7 is a cross-sectional side view after underfilling spaces between the chip and the laminate.

FIG. 7 is a cross-sectional side view after underfilling spaces/gaps between the chip 101 and the laminate 401. The underfill material 701 fills the gaps between the chip 101 and the laminate 401 around the solder bump 510 and tin-based solder bump 301. With a suitable underfill material 701, capillary action fills the gaps and enhances the integrity of the interconnect. Non-limiting examples of underfill materials 701 include silica particle loaded epoxies applied by capillary action. A thermally conducting underfill material 701 may also be used.

Figure 8:
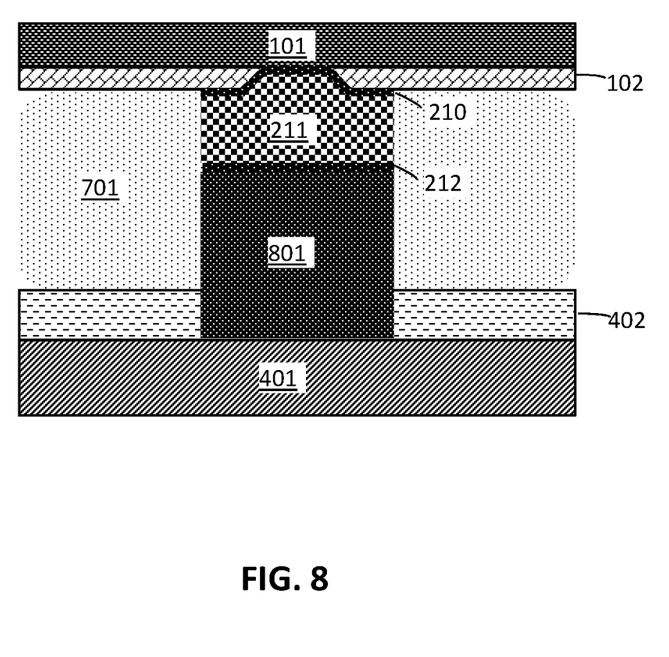
FIG. 8 is a cross-sectional side view after converting to an all metallic interconnect.

FIG. 8 is a cross-sectional side view after converting to an all intermetallic interconnect 801. In some embodiments, the intermetallic interconnect 801 includes a copper nickel tin alloy. The copper nickel tin alloy may include, for example, $(Cu_{90}Ni_{10})_6Sn_5$ to $(Cu_{90}Ni_{10})_3Sn$, depending upon the colloidal loading and whether or not there is exposed Cu on either the wafer side or laminate side. In other embodiments, the intermetallic interconnect 801 includes a copper nickel tin silver alloy.

The intermetallic interconnect 801 includes about 5 to about 10 at. % nickel, about 50 to about 60 at. % copper, and about 30 to about 45 at. % tin. When the intermetallic interconnect 801 also includes silver, the intermetallic interconnect 801 includes about 5 to about 10 at. % nickel, about 50 to about 60 at. % copper, about 25 to about 44.9 at. % tin, and about 0.1 to about 5 at. % silver A second reflow process at low temperature is performed to consume the nickel or copper shell 503 surrounding the nickel copper colloids 502 and convert to an all intermetallic joint. The reflow is performed at a temperature that is lower than the first reflow temperature and below the solder melting point. The reflow temperature may be about 125 to about 250° C., or less than 150° C.

The low temperature reflow is performed for a short period of time. The reflow may be performed for about 45 to about 75 minutes. In other embodiments, the low temperature reflow may be performed for about 10 to about 360 minutes.

During conversion to the all intermetallic interconnect 801, the volume of the metals in the pre-solder bumps (tin-based solder bump 301 and solder bump 510) is reduced. The amount of copper in the nickel copper colloids 502 and the nickel or copper shell 503 of the solder bumps 510 is chosen such that there is enough copper and nickel to fully convert.

As shown in Table 1 below, combining the proper amounts of copper and nickel will result in greater volume reduction during conversion as both metals react with tin. In an exemplary embodiment, the reduction in volume after conversion to the all intermetallic interconnect is about −4 to about −12%.

TABLE 1

| Consuming reaction | % volume change |
|---|---|
| 6 Cu + 5 Sn → $Cu_6Sn_5$ | −5.0% |
| 3 Cu + Sn → $Cu_3Sn$ | −7.4% |
| 3 Ni + 4 Sn → $Ni_3Sn_4$ | −11.3% |

Although underfilling (described in FIG. 7) is performed before conversion to the all intermetallic interconnect in the illustrative embodiment, underfilling may be performed after conversion in other embodiments. When underfilling is performed after conversion, volume reduction will occur before underfill is applied, which fills in any gaps that may occur due to the volume reduction. When underfilling is performed before conversion, chip package interactions (CPI) that may occur during conversion are substantially removed.

In an exemplary embodiment, once the tin-based solders contact the NiCu alloy, which is from 5 to 10% Ni in an exemplary embodiment (or from 3 to 15% Ni), the conversion rate to a $(Cu_{90}Ni_{10})_6Sn_5$ happens at 5 times the rate as with a Cu surface converting to $Cu_6Sn_5$. For example, if it were to take 5 hours to convert the Cu and Sn to $Cu_6Sn_5$ then it would only take 1 hour to convert the CuNi alloy to the $(Cu_{90}Ni_{10})_6Sn_5$ and at the same time consume all of the free Sn. Considering that reaction rates are also dependent upon the concentrations of the reactants, the fast conversion of free Sn with the CuNi alloy would reduce the reaction rate at the Cu surface. This leads to about only $1/10^{th}$ of the conversion rate to any exposed Cu surface if no CuNi alloy were present within the pre-solder.

Using a nickel copper alloy in the nickel copper colloids 502 instead of copper alone is also advantageous because nickel copper converts/consumes solder at a rate that is greater than copper alone. For example, the nickel copper alloy may consume solder at a rate that may be five times greater than copper alone.

Although a faster conversion rate is advantageous, the high conversion rate could compromise the solder mask (dielectric layer 402) when conversion occurs on an organic laminate 401 if the laminate material adjacent to the solder were a nickel copper alloy. However, the process disclosed herein enables full intermetallic conversion without damaging the dielectric layer 402 on the laminate 401.

As described above, various embodiments described herein provide methods of creating a pre-solder structure with colloids that include a nickel copper (NiCu) alloy surrounded by a nickel or copper shell. The colloids are properly loaded to drive a full intermetallic conversion after soldering. The method includes the subsequent thermal excursion needed to complete the conversion from the tin-based solder to an all intermetallic joint through annealing steps performed after chip join and subsequent reworks. The conversion occurs using low temperatures and short conversion times.

The described methods and structures avoid tin whisker and tin pest challenges associated with tin-based solders. The methods and structures enable the ability to pass higher current through the interconnects, as well as increase the melting point to enable deep oil drilling and automotive applications that are not shielded from engine heat.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method forming an interconnect structure, the method comprising:
    depositing a first solder bump on a chip;
    depositing a second solder bump on a laminate, the second solder bump comprising a nickel copper colloid;
    joining the chip to the laminate;
    depositing an underfill material around the first solder bump and the second solder bump; and
    performing a reflow process at a temperature that is lower than a temperature used to join the chip to the laminate to convert the first solder bump and the second solder bump to an all intermetallic interconnect.

2. The method of claim 1, wherein the nickel copper colloid is surrounded by a nickel shell.

3. The method of claim 2, wherein the nickel copper colloid surrounded by the nickel shell is suspended in a tin-based solder.

4. The method of claim 3, wherein the tin-based solder comprises a tin silver alloy.

5. The method of claim 2, wherein the nickel shell has a thickness of about 0.1 to 0.5 microns.

6. The method of claim 1, wherein the nickel copper colloid is surrounded by a copper shell.

7. The method of claim 6, wherein the nickel copper colloid surrounded by the copper shell is suspended in a tin-based solder.

8. The method of claim 7, wherein the tin-based solder comprises a tin silver alloy.

9. The method of claim 6, wherein the copper shell has a thickness of about 0.5 to about 1.0 microns.

10. The method of claim 1, wherein the first solder bump comprises a tin silver alloy.

11. The method of claim 1, wherein the reflow process is performed at a temperature in a range from about 150 to about 250° C.

12. The method of claim 1, wherein the reflow process is performed at a temperature less than 150° C.

13. The method of claim 1, further comprising applying a flux to the laminate before joining the chip with the laminate, and cleaning the flux after joining the chip to the laminate.

14. A method of forming an interconnect structure, the method comprising:
    depositing a first solder bump on a chip;
    depositing a second solder bump on a laminate, the second solder bump comprising a nickel copper colloid surrounded by a nickel or copper shell;

joining the chip to the laminate;

depositing an underfill material around the first solder bump and the second solder bump; and performing a reflow process at a temperature below a melting point of the first solder bump and the second solder bump to convert the first solder bump and the second solder bump to an all intermetallic interconnect comprising a tin nickel copper alloy.

15. The method of claim 14, wherein the nickel copper colloid comprises about 5 to about 10 atomic % (at. %) nickel.

16. The method of claim 14, wherein the reflow process is performed at a temperature in a range from about 150 to about 250° C.

17. The method of claim 14, wherein performing the reflow process reduces a volume of the first solder bump and the second solder bump by about 4% to about 12%.

18. The method of claim 14, wherein the copper shell has a thickness in a range from about 0.5 to about 1.0 micrometers.

19. The method of claim 14, wherein the first solder bump comprises tin.

20. The method of claim 14, wherein the second solder bump comprises tin.

* * * * *